(12) United States Patent
Ishihara

(10) Patent No.: US 7,821,057 B2
(45) Date of Patent: Oct. 26, 2010

(54) NONVOLATILE SEMICONDUCTOR MEMORY DEVICE AND MANUFACTURING METHOD THEREOF

(75) Inventor: Takamitsu Ishihara, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/457,757

(22) Filed: Jun. 19, 2009

(65) Prior Publication Data

US 2009/0261399 A1    Oct. 22, 2009

Related U.S. Application Data

(62) Division of application No. 11/643,904, filed on Dec. 22, 2006, now abandoned.

(30) Foreign Application Priority Data

Jul. 3, 2006    (JP)    ............... 2006-183658

(51) Int. Cl.
   *H01L 29/94*    (2006.01)
(52) U.S. Cl. .................. 257/321; 257/314; 257/315; 257/316; 257/E29.129
(58) Field of Classification Search ................ 257/314, 257/315, 316, 321, E29.129
   See application file for complete search history.

(56) References Cited

U.S. PATENT DOCUMENTS

| 6,330,187 | B1 | 12/2001 | Choi et al. |
| 2006/0267067 | A1 | 11/2006 | Ishihara |

FOREIGN PATENT DOCUMENTS

| JP | 6-5874 | 1/1994 |
| JP | 6-204488 | 7/1994 |
| JP | 7-94609 | 4/1995 |
| JP | 7-161850 | 6/1995 |
| JP | 7-297299 | 11/1995 |
| JP | 8-55921 | 2/1996 |
| JP | 2000-332138 | 11/2000 |
| JP | 2001-291784 | 10/2001 |
| JP | 2002-43443 | 2/2002 |
| JP | 2003-124364 | 4/2003 |

OTHER PUBLICATIONS

N. Mohapatra et al., "Chisel Programming Operation of Scaled NOR Flash EEPROMs—Effect of Voltage Scaling, Device Scaling and Technological Parameters," IEEE Transactions on Electron Devices, vol. 50, No. 10, pp. 2104-2111 (Oct. 2003).

Notification of Reasons for Rejection issued by the Japanese Patent Office on Nov. 4, 2008, for Japanese Patent Application No. 2006-183658, and English-language translation thereof.

Final Notice of Rejection mailed by the Japanese Patent Office on Jan. 27, 2009, for Japanese Patent Application No. 2006-183658, and English language translation thereof.

*Primary Examiner*—Tan N Tran
(74) *Attorney, Agent, or Firm*—Finnegan, Henderson, Farabow, Garrett & Dunner, L.L.P.

(57) ABSTRACT

A nonvolatile semiconductor memory device includes a semiconductor substrate of a first conductivity type, a pair of source and drain diffusion regions of a second conductivity type oppositely formed on a surface of the semiconductor substrate, and a stacked structure having a gate insulating film, a charge accumulation film, an interlayer insulating film and a control gate which are formed in order on a channel region of the surface of the semiconductor substrate interposed between the source and drain diffusion regions. An edge of the stacked structure in the vicinity of the source region is formed away from a junction position between the source diffusion region and the channel region.

3 Claims, 18 Drawing Sheets

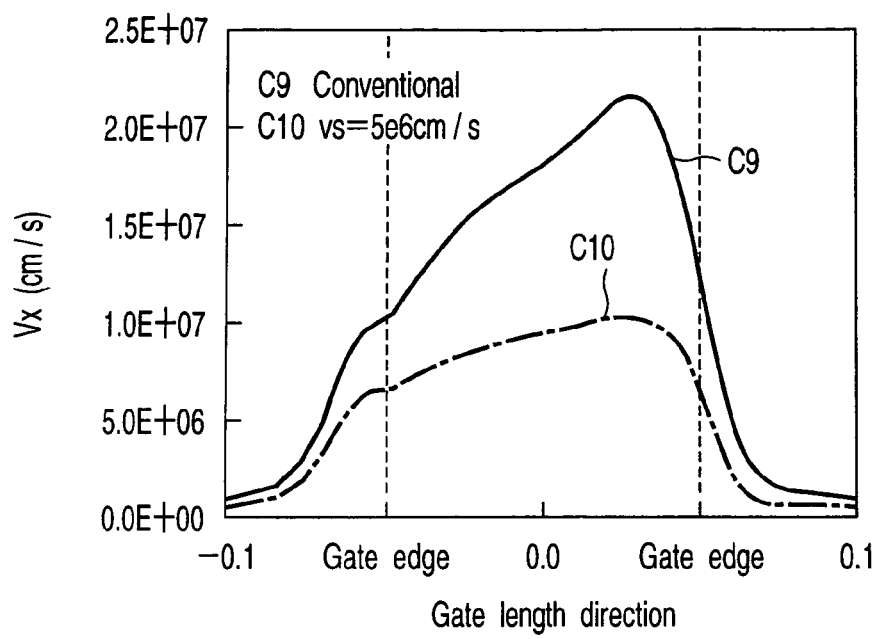
F I G. 3    (PRIOR ART)
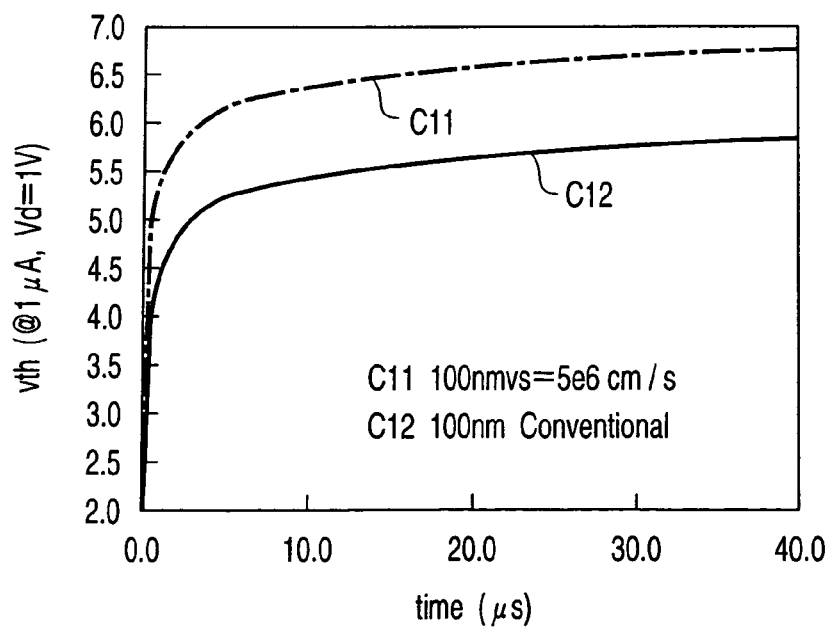
F I G. 4    (PRIOR ART)

L1 Conventional
L2 Source offset
L3 Drain offset

L1 Conventional
L2 Source offset
L3 Drain offset

L1 Conventional
L4 Source halo
---- Gate edge
---- Gate edge

L1 Conventional
L4 Source halo
---- Gate edge
---- Gate edge

L1 Conventional
L4 Source halo
---- Gate edge
---- Gate edge

FIG.28
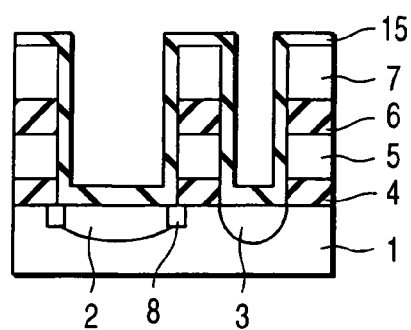
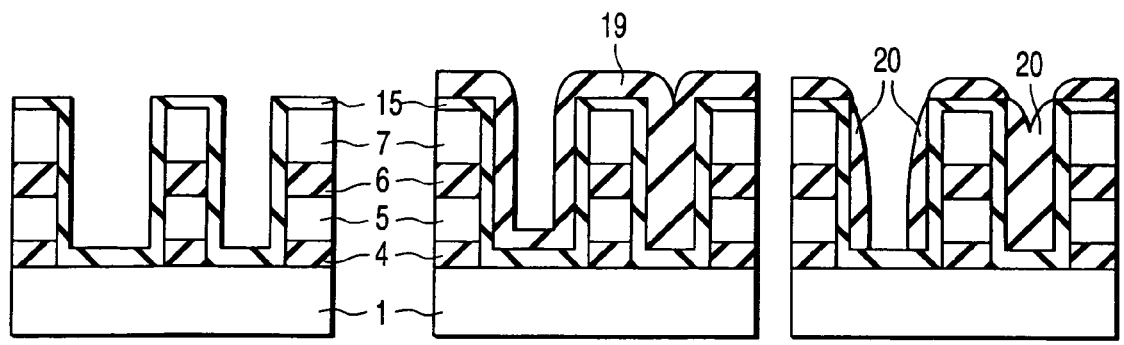
FIG.29A  FIG.29B  FIG.29C
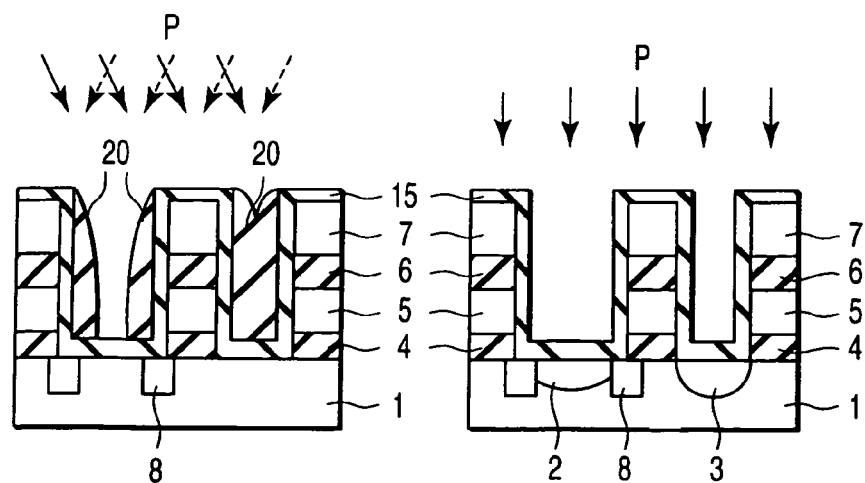
FIG.29D  FIG.29E

NONVOLATILE SEMICONDUCTOR MEMORY DEVICE AND MANUFACTURING METHOD THEREOF

CROSS-REFERENCE TO RELATED APPLICATIONS

This application is a divisional of application Ser. No. 11/643,904, filed Dec. 22, 2006, now abandoned and is based upon and claims the benefit of priority from prior Japanese Patent Application No. 2006-183658, filed Jul. 3, 2006, the entire contents of all of which are incorporated herein by reference.

BACKGROUND OF THE INVENTION

1. Field of the Invention

The present invention relates to a NOR-type nonvolatile semiconductor memory device and a manufacturing method thereof capable of decreasing a power supply voltage without causing write characteristics to deteriorate.

2. Description of the Related Art

Recently, demands for NOR-type flash memories have been rapidly increasing along with a rapid growth in markets of memory media including digital cameras and portable audio equipment including mobile telephones. At present, in order to achieve smaller sizes, lighter weights and enhanced functions of these devices, there are increasing requests for miniaturization, higher integration, lower power supply voltages and enhanced reliability in the NOR-type flash memories.

The NOR-type flash memory has a plurality of MOS are NOR-connected. As is well known, one element comprises a source diffusion layer and a drain diffusion layer oppositely formed on the surface of a semiconductor substrate, and a gate insulating film, a floating gate, an intergate insulating film and a control gate which are stacked on the semiconductor substrate between the source diffusion layer and the drain diffusion layer.

In contrast to a NAND-type flash memory which achieves writing by FN tunneling, the NOR-type flash memory implants hot electrons (HE) generated by use of electric field concentration at a drain edge into the floating gate to write information. At this point, because a voltage is applied to a drain electrode, there is caused a problem of deterioration of the gate insulating film located in the vicinity of the drain electrode. Thus, simple miniaturization of a gate length causes the deterioration of write characteristics.

While many reports have been made regarding problems and improvements in the size reduction of the NOR-type flash memory, a study has been conducted on the characteristics of writing achieved by secondary electrons induced in a channel, for example, in IEEE trans. Electron Devices, Vol. 50, No. 10, October 2003, pp. 2104-2111, wherein there are reported deterioration due to scaling (size reduction), the optimization of device parameters, trade-off for problems at the drain edge, etc.

However, it is known that write efficiency deteriorates as the gate length decreases, and simple miniaturization in conventional structures has already reached the limits. It has therefore been desired to achieve a NOR-type nonvolatile semiconductor memory device and a manufacturing method thereof capable of improving the write efficiency of the micro NOR-type flash memory.

BRIEF SUMMARY OF THE INVENTION

According to one aspect of the invention, there is provided a nonvolatile semiconductor memory device, which includes:
a semiconductor substrate of a first conductivity type;
a pair of a source diffusion region and a drain diffusion region of a second conductivity type oppositely formed on a surface of the semiconductor substrate; and
a stacked structure having a gate insulating film, a charge accumulation film, an interlayer insulating film and a control gate which are formed in order on a channel region of the surface of the semiconductor substrate interposed between the source diffusion region and the drain diffusion region, an edge of the stacked structure in the vicinity of the source region being formed away from a junction position between the source diffusion region and the channel region.

BRIEF DESCRIPTION OF THE SEVERAL VIEWS OF THE DRAWING

FIG. 3 is a diagram showing the influence of an electron saturation velocity on an electron velocity in the gate length direction on the substrate surface in the conventional NOR-type nonvolatile semiconductor memory devices;

FIG. 4 is a diagram showing the influence of the electron saturation velocity on write characteristics in the conventional NOR-type nonvolatile semiconductor memory devices;

FIGS. 6A and 6B are sectional views showing device structures used in a simulation in the first embodiment, wherein FIG. 6A shows a source edge offset structure, and FIG. 6B shows a drain edge offset structure;

FIG. 28 is a sectional view showing an element structure of a nonvolatile semiconductor memory device in a fifth embodiment;

FIGS. 29A to 29E are sectional views showing a method of manufacturing the nonvolatile semiconductor memory device in the fifth embodiment;

DETAILED DESCRIPTION OF THE INVENTION

Figure 1:
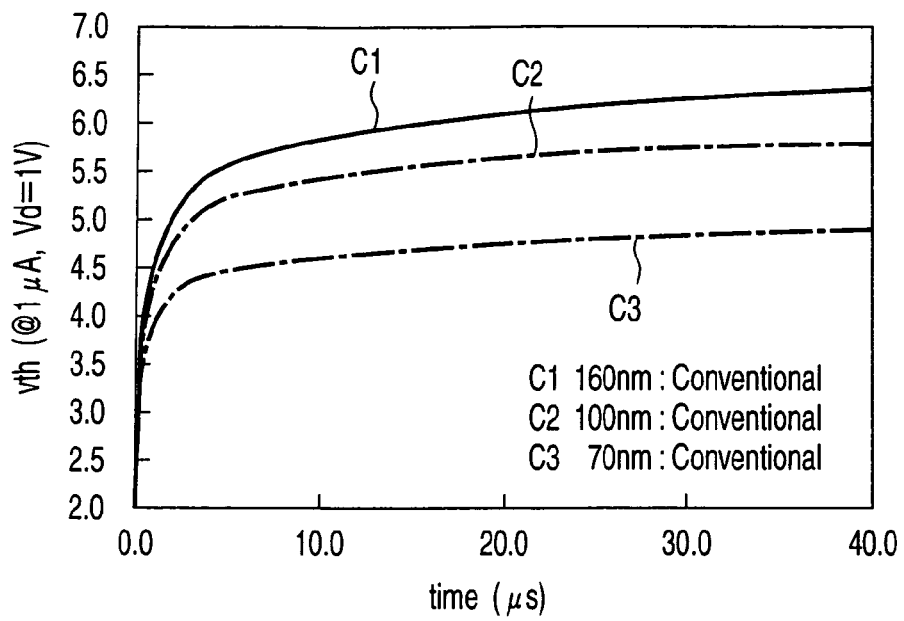
FIG. 1 is a diagram showing write characteristics (threshold voltages) of conventional NOR-type nonvolatile semiconductor memory devices.

Before describing embodiments of the present invention, problems of a hot electron implantation NOR-type flash memory will be described. FIG. 1 shows data in which gate length dependency of write characteristics of the NOR-type flash memory (using a p-type substrate) is simulated. This graph shows how threshold values change due to electrons written into a floating gate, wherein the horizontal axis indicates time (writing time) of applying a drain voltage. The voltage of a control gate is set at 9V. A greater change in the threshold value means better write efficiency of hot electrons. As is apparent from this graph, the write efficiency deteriorates as the gate length decreases. Therefore, simple miniaturization in conventional structures has already reached the limit.

Figure 2:
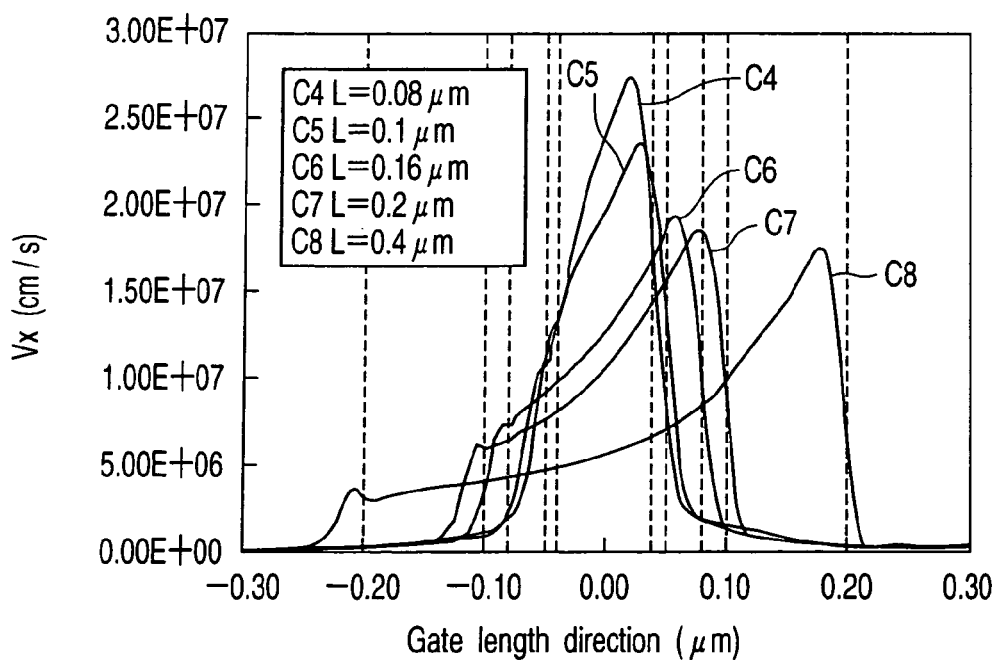
FIG. 2 is a diagram showing an electron velocity distribution in a gate length direction on a substrate surface in the conventional NOR-type nonvolatile semiconductor memory devices.

Thus, further miniaturization causes the write characteristics to deteriorate because an electron velocity at a drain edge significantly increases. FIG. 2 actually shows an electron velocity distribution in a gate length direction on a substrate surface. It can be understood that the electron velocity at the drain edge increases as the gate length decreases. The implantation of the hot electrons into the floating gate occurs at the drain edge. Therefore, the electrons are implanted into a drain as they are before becoming hot due to the increase in the electron velocity at the drain edge, resulting in deteriorated write efficiency. This suggests the possibility that the suppression of overshoot of the electron velocity at the drain edge can improve the write efficiency.

FIG. 3 actually shows the electron velocity distribution in the gate length direction on the substrate surface when an electron saturation velocity is halved as compared with that in a conventional model. If the electron saturation velocity is halved, the electron velocity at the drain edge becomes much lower. If the electron saturation velocity is further halved, the write efficiency can be improved, as shown in FIG. 4. Therefore, it can be understood that the velocity overshoot has only to be suppressed in order to improve the write efficiency.

In the present invention, the peak position of electric field concentration is displaced to a source side due to the presence of a high-resistance offset region formed by controlling an impurity distribution at a source edge, so that the implantation of the hot electrons into a drain diffusion region is suppressed, and the velocity overshoot at the edge of the drain diffusion region is also suppressed, thereby making it possible to provide a NOR-type nonvolatile semiconductor memory device with significantly improved write characteristics.

The embodiments of the present invention will hereinafter be described with reference to the drawings.

FIRST EMBODIMENT

Figure 5:
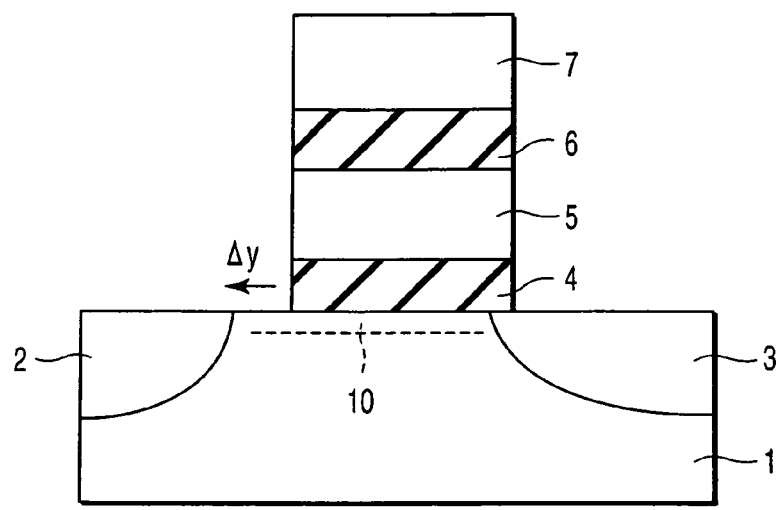
FIG. 5 is a sectional view showing an element structure of a NOR-type nonvolatile semiconductor memory device in a first embodiment.

As shown in FIG. 5, in a NOR-type nonvolatile semiconductor memory device according to a first embodiment of the present invention, a source diffusion region 2 and a drain diffusion region 3 are oppositely formed in a semiconductor substrate 1, and on the surface of the semiconductor substrate 1 between the source diffusion region 2 and the drain diffusion region 3, there is formed a stacked gate structure including a gate insulating film 4, a floating gate (charge accumulation layer) 5, an intergate (interlayer) insulating film 6 and a control gate 7. The semiconductor substrate surface under the stacked gate structure is a channel region 10 where a channel is formed when a drive voltage is applied to the control gate 7. In this element structure, the source diffusion region 2 is formed to be offset by $\Delta y$ from the edge of the floating gate 5.

It should be noted that in the NOR-type flash memory in general, the conductivity type of the semiconductor substrate 1 is p type, the source diffusion region 2 and the drain diffusion region 3 are n type, and carriers are electrons, but the conductivity types can be reversed and the carriers can be holes. In the following description, the carriers are electrons.

Here, the overlapping position relation among the source diffusion region 2, the drain diffusion region 3 and the floating gate 5 is defined. As schematically shown in FIG. 5, the structure in which the stacked gate structure does not overlap the source diffusion region 2 but overlaps the edge of the drain diffusion region 3 is called a source edge offset structure. In contrast, a structure in which the drain diffusion region 3 does not overlap the floating gate 5 but the source diffusion layer region 2 overlaps the floating electrode 5 is called a drain edge offset structure.

Figures 6A, 6B:
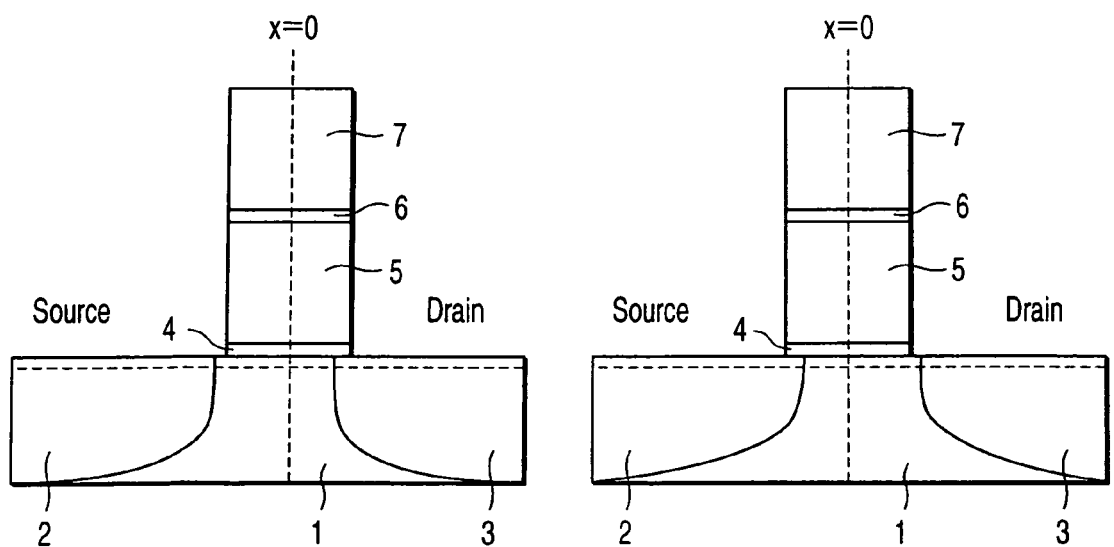

First, a simulation will be described which has been carried out to explain that the structure in FIG. 5 is effective in the NOR-type flash memory. Models as shown in FIGS. 6A and 6B are used for the simulation. FIG. 6A shows a source edge offset model, and FIG. 6B shows a drain edge offset model. In addition to this, a simulation has also been carried out for a conventional product in which the floating gate 5 equally overlaps the source diffusion region 2 and the drain diffusion region 3, but a structure thereof is not shown.

Figure 7:
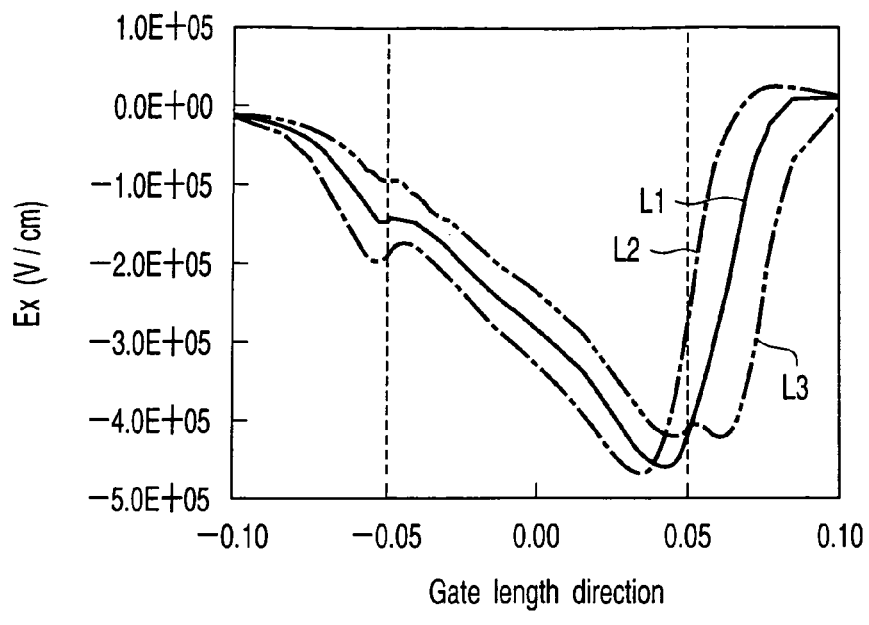
FIG. 7 is a diagram showing an electric field distribution in a gate length direction on a substrate surface in the nonvolatile semiconductor memory device in the first embodiment.

In the source offset structure shown in FIG. 6A, overshoot (excess over an expected value) of an electron velocity in a gate length direction is suppressed at the gate edge in the vicinity of the drain, as compared with the conventional structure. Such effects can be understood from an electric field distribution in the gate length direction, as shown in FIG. 7. In FIG. 7, the center line of the gate electrode is set at 0 so that profiles of electric field strength (Ex [V/cm]) in the gate length direction are calculated. L1 is the electric field strength profile of the conventional product, L2 is the electric field strength profile of the source edge offset structure, and L3 is the electric field strength profile of the drain edge offset structure. Dotted lines drawn perpendicularly to the horizontal axis are the source side edge and the drain side edge of the floating gate electrode 5.

As understood from FIG. 7, the peak position of an electric field in the gate length direction is more displaced to the source side in the source edge offset structure. Thus, the range of a region where the electrons are accelerated is narrower, and the increase of electron energy is suppressed, such that the velocity overshoot is suppressed.

Figure 8:
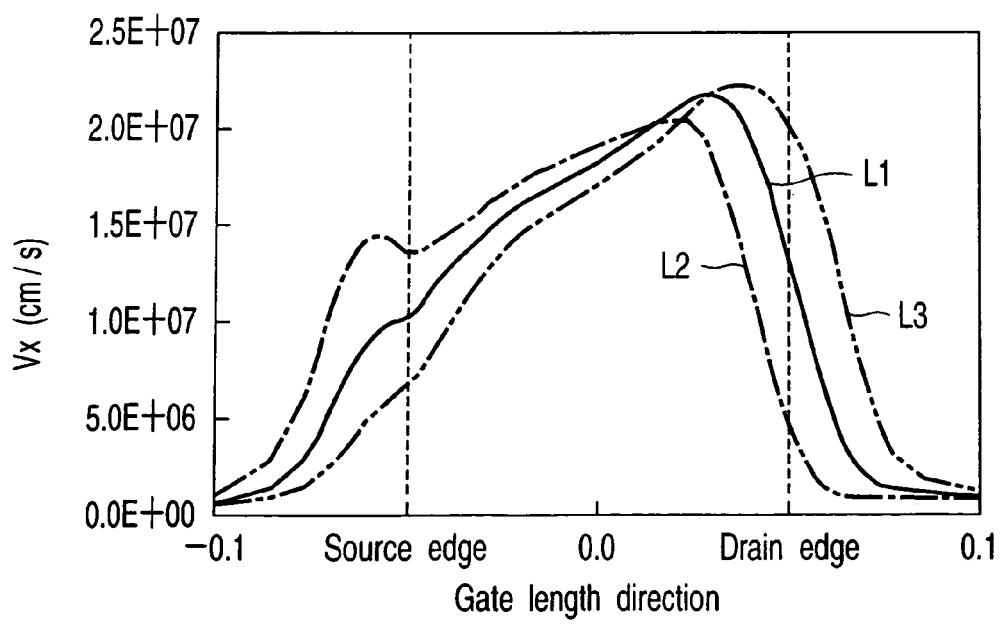
FIG. 8 is a diagram showing an electron velocity distribution in the gate length direction on the substrate surface in the nonvolatile semiconductor memory device in the first embodiment.

On the other hand, in the drain edge offset structure, the drain diffusion layer 3 is farther away from the gate edge, so that a peak of electric field concentration not only emerges at the gate edge on the drain side but also emerges at a drain electrode edge. This enlarges the electric field concentrated region where the electrons are accelerated, and therefore, the electron energy further increases. As a result, the velocity overshoot becomes more obvious. Therefore, as shown in FIG. 8, while write efficiency is improved in the source edge offset structure, the write efficiency rather deteriorates in the drain edge offset structure. It should be noted that the vertical axis indicates the velocity (Vx [cm/s]) of the electrons in FIG. 8.

Figure 9:
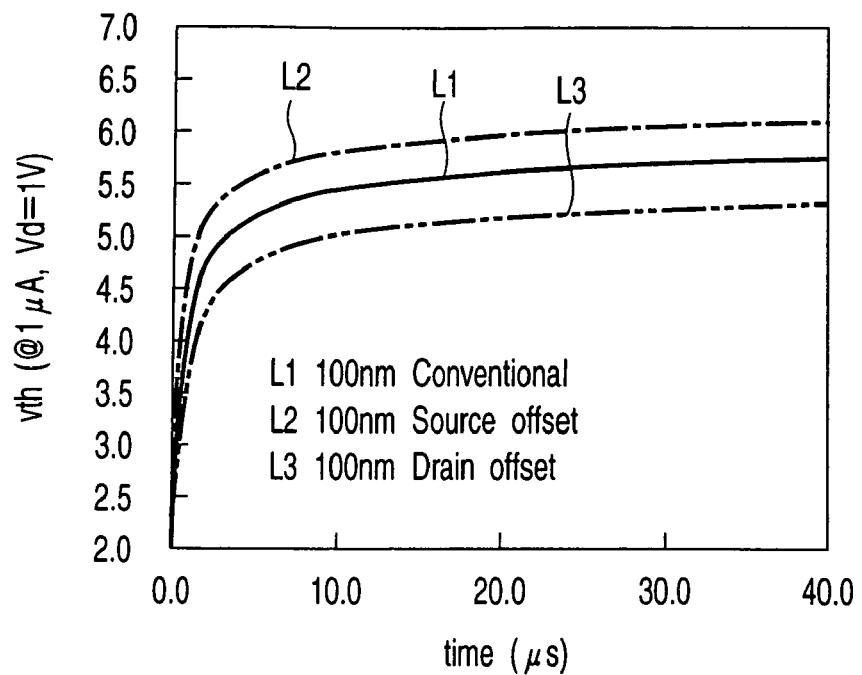
FIG. 9 is a diagram of rising characteristics of threshold voltages in the nonvolatile semiconductor memory device in the first embodiment and shows that write characteristics are improved.

Furthermore, FIG. 9 shows rising characteristics of Vth (1 μA, Vd=1V) at a gate length of 100 nm for comparison among the conventional product, the source edge offset structure and the drain edge offset structure. It can be understood that the rising characteristics, that is, write characteristics are improved by the source edge offset structure.

Thus, the write characteristics can be improved by the source edge offset structure shown in FIG. 5. The formation of the offset structure at the source edge rather than at the drain edge is effective.

Figure 10:
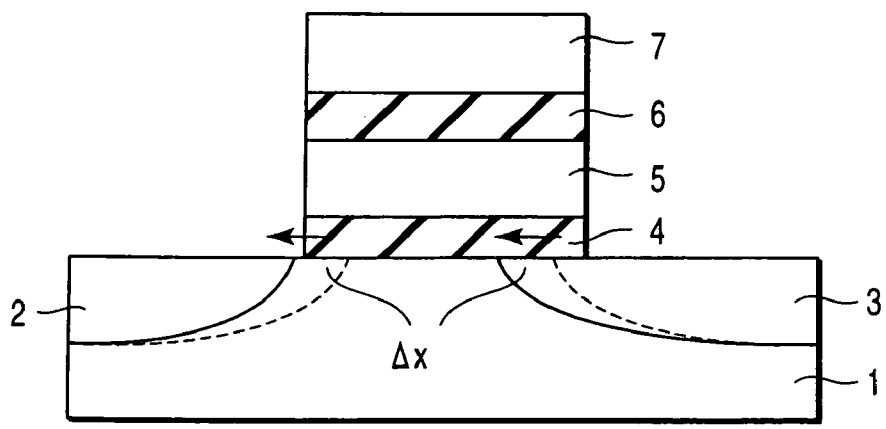
FIG. 10 is a sectional view for explaining a factor of a characteristic improvement in the nonvolatile semiconductor memory device in the first embodiment.
Figure 11:
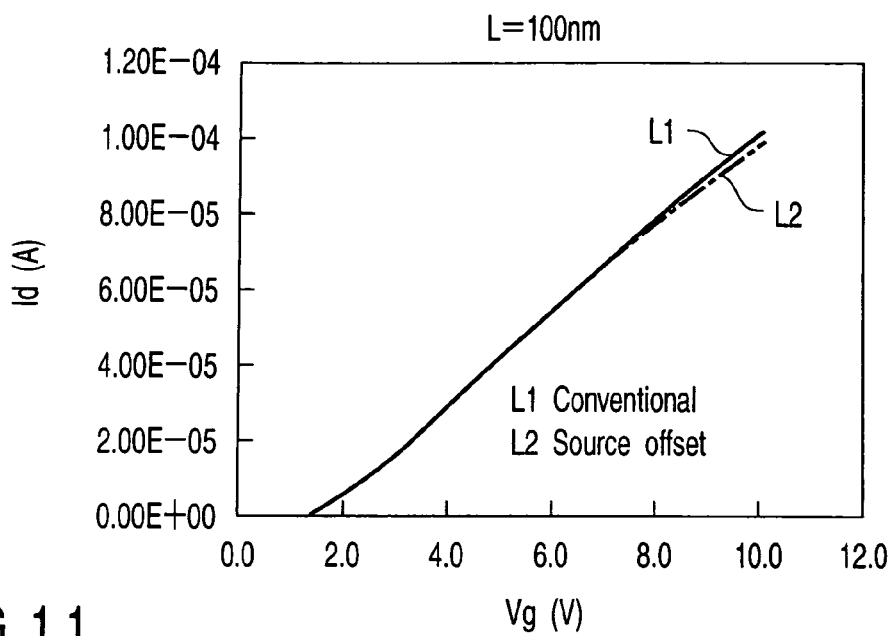
FIG. 11 is a diagram showing current/voltage characteristics of the nonvolatile semiconductor memory device in the first embodiment.

However, when a high-resistance offset region is formed at the source edge as in FIG. 5, there is concern over deterioration of current drive force. However, as shown in FIG. 10, when the source edge is moved by $\Delta x$ to the source side to provide the high-resistance offset region at the source edge, a drain diffusion region can also be moved by $\Delta x$ to the source side to suppress the deterioration of the current drive force. FIG. 11 shows a drain current (Id) when a drain voltage is 0.8V and the gate length is 100 nm in the structure shown in FIG. 10. The horizontal axis indicates a floating gate voltage (Vg). It can be understood that the current drive force hardly changes as compared with that in the conventional structure.

Thus, in the first embodiment of the present invention, the high-resistance offset region is provided at the source edge, and the drain diffusion region profile is optimized, thereby making it possible to improve the write characteristics of the NOR-type flash memory without causing the current drive force to deteriorate.

Figure 12:
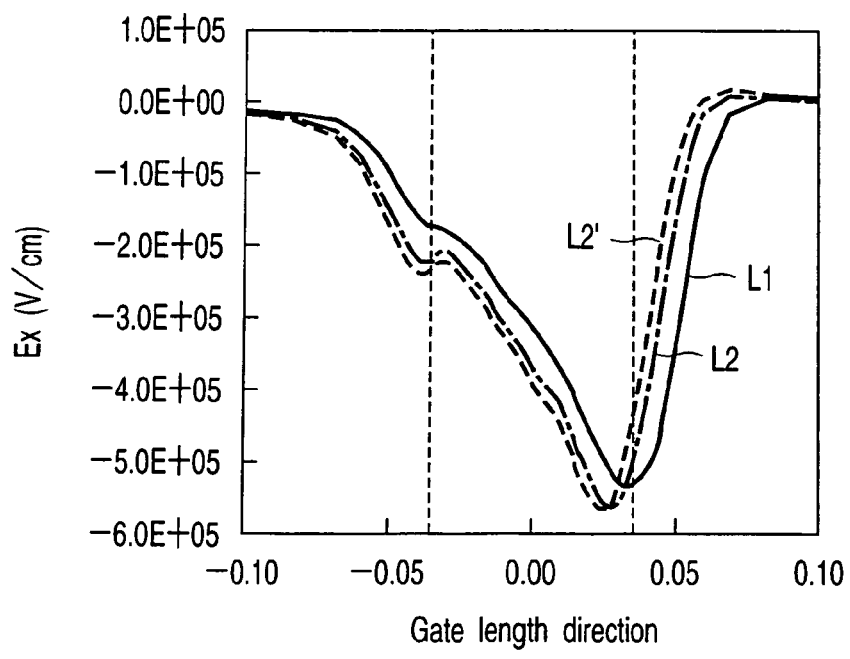
FIG. 12 is a diagram showing that the electric field distribution in the gate length direction on the substrate surface changes depending on the size of a high-resistance region at a source edge, in the nonvolatile semiconductor memory device in the first embodiment.
Figure 13:
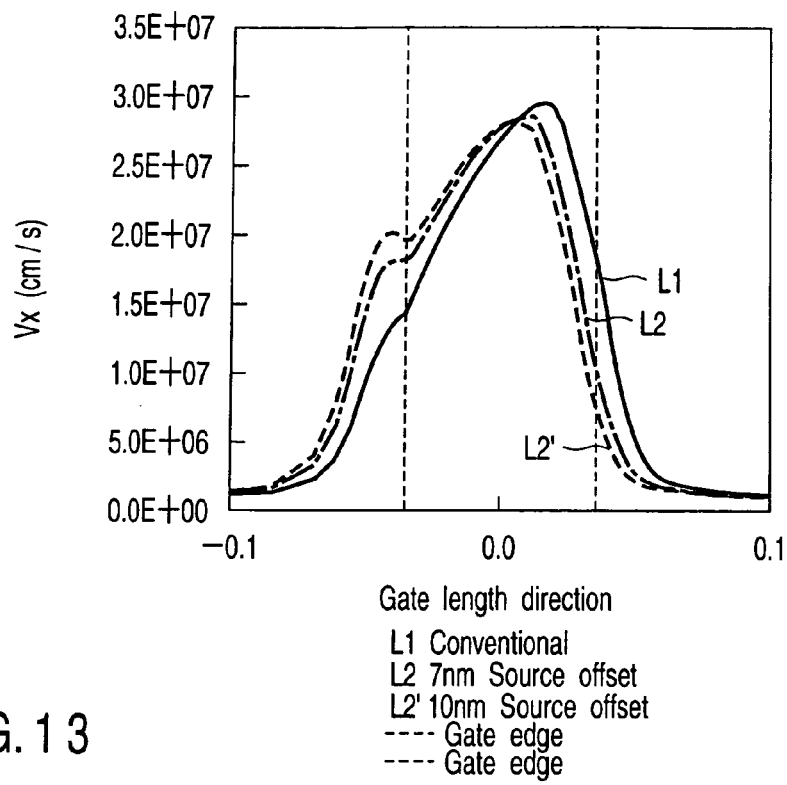
FIG. 13 is a diagram showing that the velocity distribution in the gate length direction on the substrate surface changes depending on the size of the high-resistance region at the source edge, in the nonvolatile semiconductor memory device in the first embodiment.

FIGS. 12 to 15 are characteristic diagrams showing that a distance $\Delta y$ between the gate edge and a source junction position shown in FIG. 5 can be adjusted to improve the write characteristics. It should be noted that the gate length is 70 nm in FIGS. 12 to 15. FIG. 12 shows profiles of electric field strengths when the source offset $\Delta y$ is changed to 0 nm (conventional product), 7 nm and 10 nm. As understood from FIG. 12, an increase of $\Delta y$ displaces the peak position of the electric field concentration to the source side, so that the velocity overshoot is suppressed, as shown in FIG. 13.

Figure 14:
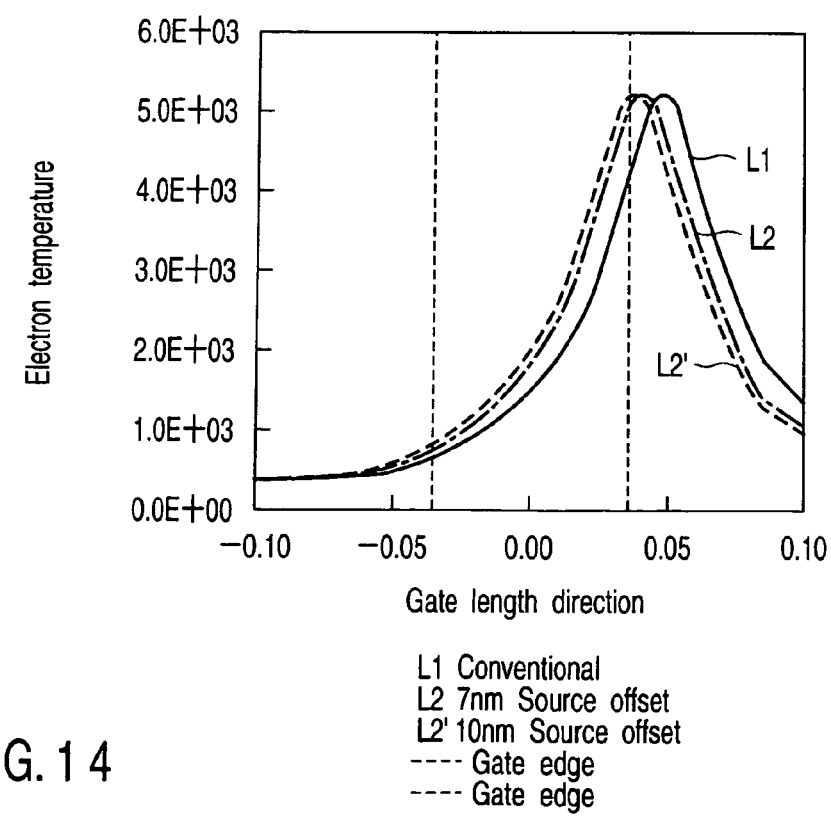
FIG. 14 is a diagram showing that an electron temperature distribution in the gate length direction on the substrate surface changes depending on the size of the high-resistance region at the source edge, in the nonvolatile semiconductor memory device in the first embodiment.

Furthermore, as shown in FIG. 14, the peak position of electron temperature is also more displaced to the source side. In the conventional structure, since the peak position of the electron temperature is present on the drain side, hot electrons flow into the drain diffusion region as they are. The displacement of the peak position of the electron temperature to the source side means more displacement of an implanting position of the hot electrons to the source side, such that there is an advantage of suppressing the flowing of the hot electrons into the drain diffusion region.

Figure 15:
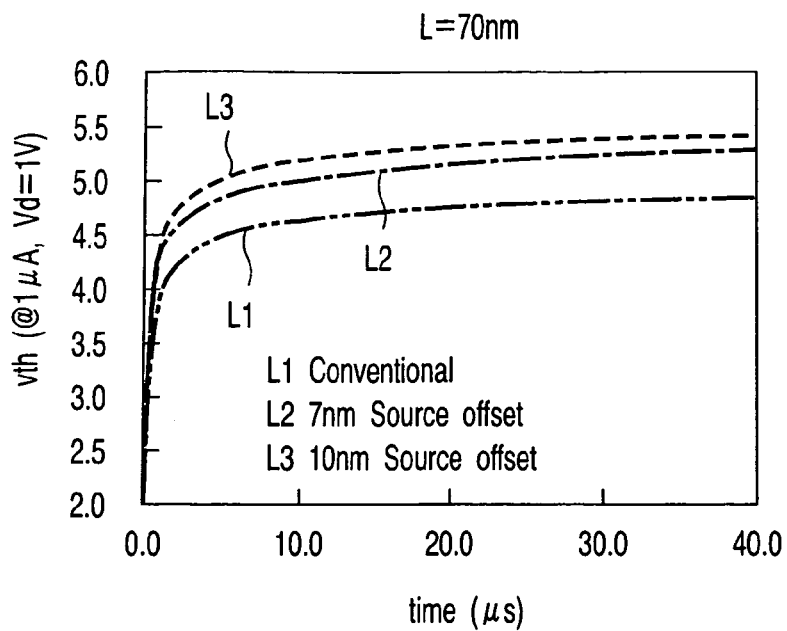
FIG. 15 is a diagram showing that the write characteristics (threshold voltages) change depending on the size of the high-resistance region at the source edge, in the nonvolatile semiconductor memory device in the first embodiment.

Moreover, FIG. 15 shows rising characteristics of Vth (1 μA, Vd=1V) at a gate length of 70 nm for comparison among the conventional product, a source edge offset of 7 nm and a drain edge offset of 10 nm. It can be understood that the rising characteristics are improved as the source edge offset is increased. Thus, the size of the high-resistance offset region at the source edge can be controlled to control the write characteristics.

Figure 16:
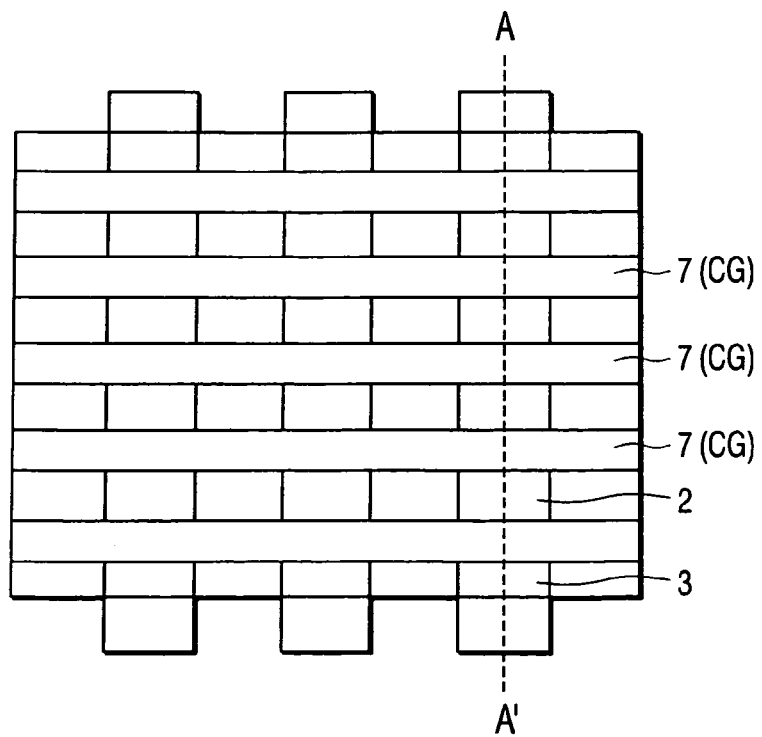
FIG. 16 is a plan view showing the arrangement of cell transistors of the nonvolatile semiconductor memory device in the first embodiment.

FIGS. 17A to 17G are sectional views showing stepwise a manufacturing method to form the device structure shown in FIG. 15 in which the offset region is provided at the source edge, and FIGS. 17A to 17G correspond to sectional views along the A-A' line in a plan view shown in FIG. 16. To explain the plan view (FIG. 16) in more detail, memory elements (cell transistors) shown in FIG. 5 are arranged in matrix form so that the cell transistors adjacent in the same column share the drain or source. In addition, the control gates 7 of the cell transistors in the same row are connected in common to a control gate line CG.

The manufacturing method is as follows. First, layers to be the gate (tunnel) insulating film 4, the floating gate 5, the intergate (interlayer) insulating film 6 and the control gate 7 are stacked on the substrate 1 in order (FIG. 17A), and lithography is used to carry out stacked gate patterning, and then a sidewall insulating film 15 is formed by an oxidation process to form a structure shown in FIG. 17B. Here, the floating gate 5 and the control gate 7 are formed of, for example, polysilicon.

Figures 17A, 17B, 17C:
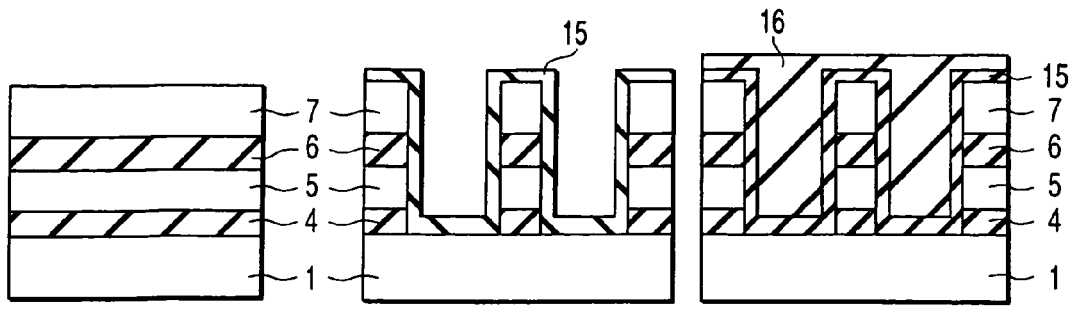
FIGS. 17A to 17G are sectional views along the A-A' line in FIG. 16 showing stepwise a method of manufacturing the nonvolatile semiconductor memory device in the first embodiment.
Figures 17D, 17E, 17F:
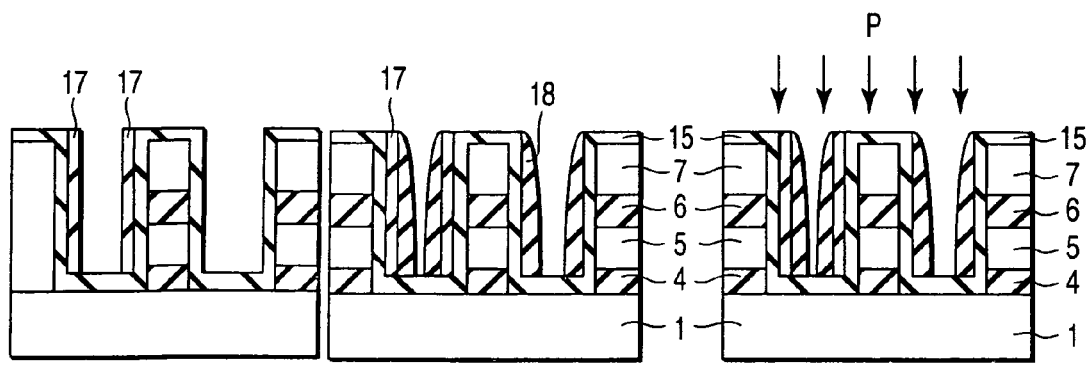
Figures 17G, 18:
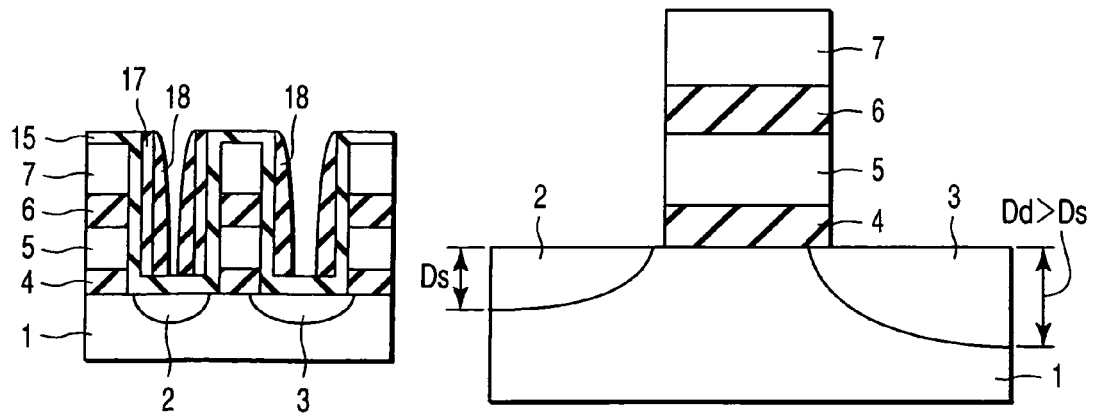
FIG. 18 is a sectional view showing an element structure of a nonvolatile semiconductor memory device in a second embodiment.

Next, as shown in FIG. 17C, an interlayer (embedded) insulating film 16 is deposited, and a sidewall insulating film 17 is formed only on the side of a source diffusion region by pattering using a mask as shown in FIG. 17D. Then, a sidewall insulating film 18 is formed (FIG. 17E), and impurities (e.g., phosphorous [P] as n-type impurities) for the formation of the source/drain diffusion regions are ion-implanted over the sidewall insulating film 18 (FIG. 17F), such that a device structure can be formed in which the high-resistance offset region is formed only at the source edge (FIG. 17G). Here, the insulating film 17 and the insulating film 18 used as the sidewall insulating films need to be in a selected ratio. For example, when TEOS is used as the insulating film 17, it is necessary to use a silicon nitride film as the insulating film 18. In contrast, when the silicon nitride film is used as the insulating film 17, TEOS is used as the insulating film 18.

As described above, according to the first embodiment, the provision of the high-resistance offset region at the source edge can improve the write characteristics.

SECOND EMBODIMENT

In a NOR-type nonvolatile semiconductor memory device according to a second embodiment of the present invention, a diffusion depth Ds of a source diffusion region 2 is formed to be less (shallower) than a diffusion depth Dd of a drain diffusion region 3, as shown in FIG. 18. Thus, a high-resistance region is provided at a source edge, so that velocity overshoot is suppressed, and write efficiency can be improved, as has been described in the first embodiment of the present invention.

FIGS. 19A to 19G are sectional views showing stepwise a method of manufacturing the NOR-type nonvolatile semiconductor memory device according to the second embodiment of the present invention, and a plan view thereof is similar to FIG. 16. First, layers to be a tunnel insulating film 4, a floating gate 5, an intergate insulating film 6 and a control gate 7 are stacked on a substrate 1 in order (FIG. 19A), and lithography is used to carry out stacked gate patterning, and then a sidewall insulating film 15 is formed by an oxidation process to form a structure shown in FIG. 19B.

Figures 19A, 19B, 19C:
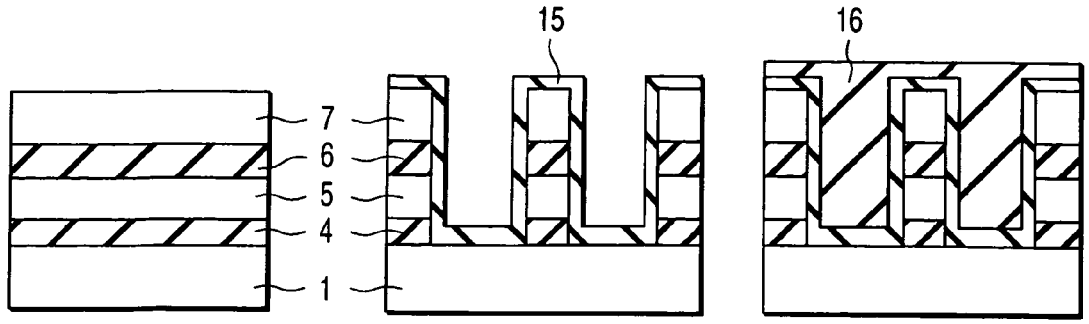
FIGS. 19A to 19G are sectional views showing stepwise a method of manufacturing the nonvolatile semiconductor memory device in the second embodiment.

Next, as shown in FIG. 19C, an interlayer (embedded) insulating film 16 is deposited, so that air gaps between cell transistors are filled. As required, an upper surface portion of the interlayer insulating film 16 may be flattened by means such as chemical mechanical polishing (CMP). Then, as shown in FIG. 19D, the interlayer insulating film 16 on the drain diffusion region is removed by pattering using a mask, thereby obtaining a structure shown in FIG. 19E.

Figures 19D, 19E, 19F:
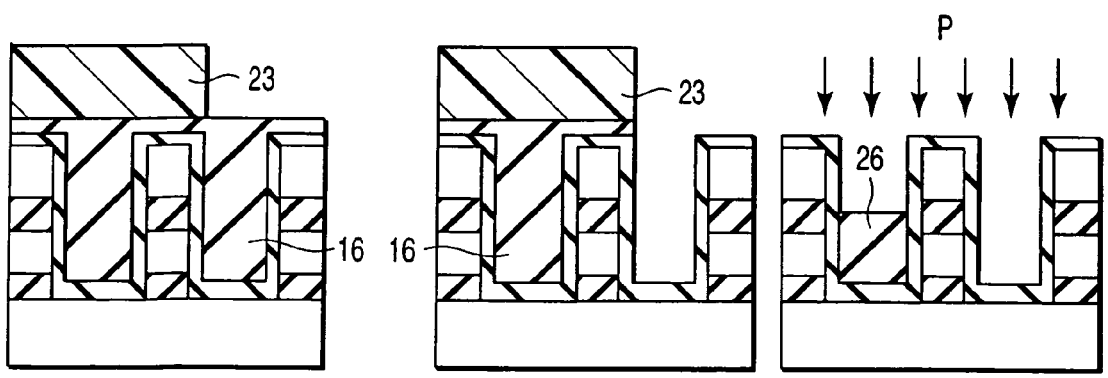
Figure 19G:
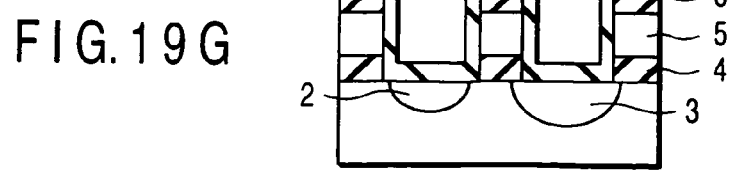

Next, as shown in FIG. 19F, the interlayer insulating film 16 remaining on the source diffusion region side is adjusted to a desired height by removing means such as etching. Impurities (e.g., P) for the formation of the source and drain diffusion regions are ion-implanted over the interlayer insulating film 16 remaining on the source diffusion region side, such that the source diffusion region 2 can be formed shallower than the drain diffusion region 3, as shown in FIG. 19G. Thus, the element structure shown in FIG. 18 can be manufactured.

As described above, the depth of the source diffusion region 2 is shallower than the depth of the drain diffusion region 3, such that the high-resistance offset region can be provided at the source edge, and write characteristics can be improved, as in the first embodiment.

THIRD EMBODIMENT

Figure 20:
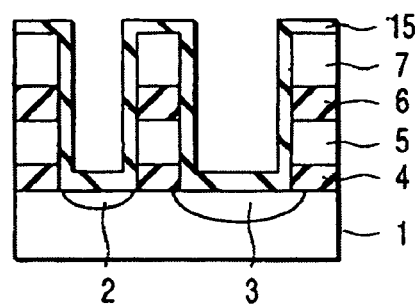
FIG. 20 is a sectional view showing an element structure of a nonvolatile semiconductor memory device in a third embodiment.

A mask is added to form a desired device structure in the manufacturing method of the second embodiment. However, it is desirable to prevent the addition of the mask as much as possible from the viewpoint of a manufacturing cost reduction. In a device structure of a NOR-type nonvolatile semiconductor memory device according to a third embodiment shown in FIG. 20, it is possible to form a high-resistance offset region only at a source edge without adding the mask. That is, in the device structure shown in FIG. 20, an intercell distance on a source side is formed to be less than an intercell distance on a drain side. Such a structure makes it possible to form the high-resistance offset region only at the source edge without adding the mask, as described below.

FIGS. 21A to 21E are sectional views showing stepwise a method of manufacturing the NOR-type nonvolatile semiconductor memory device according to the third embodiment of the present invention, and a plan view thereof is similar to FIG. 16. First, layers to be a tunnel insulating film 4, a floating gate 5, an intergate insulating film 6 and a control gate 7 are stacked on a substrate 1 in order, and lithography is used to carry out stacked gate patterning, and then a sidewall insulating film 15 is formed by an oxidation process to form a structure shown in FIG. 21A. Here, in the gate patterning using the lithography, the intercell distance on the source side is formed to be less than the intercell distance on the drain side.

Figures 21A, 21B, 21C:
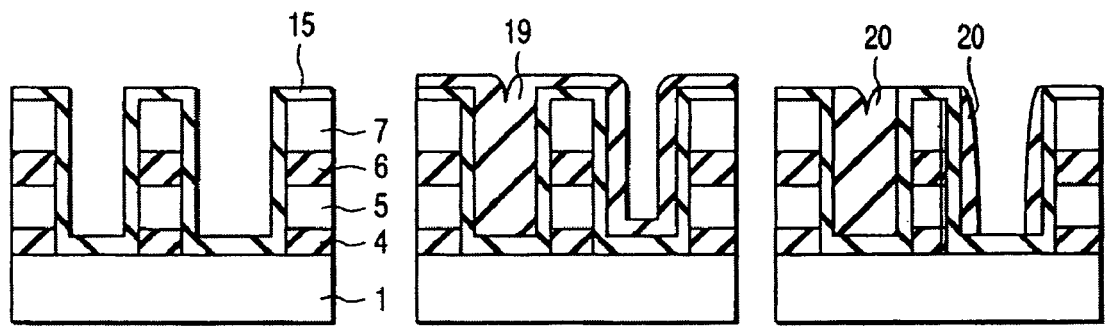
FIGS. 21A to 21E are sectional views showing stepwise a method of manufacturing the nonvolatile semiconductor memory device in the third embodiment.

Next, as shown in FIG. 21B, an interlayer (embedded) insulating film 19 is deposited. The insulating film 19 may be any insulating film as long as it is in a selected ratio to the sidewall insulating film 15 which covers the stacked structure (hereinafter referred to as a cell transistor) comprising the substrate 1, the tunnel insulating film 4, the floating gate 5, the intergate insulating film 6 and the control gate 7, and such an insulating film includes a silicon nitride film.

Figures 21D, 21E:
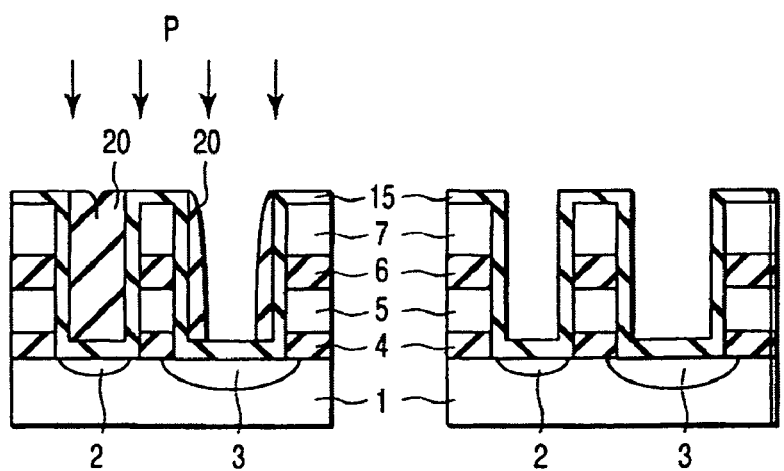

Next, as shown in FIG. 21C, the interlayer insulating film 19 is etched to form a sidewall insulating film 20. Now, since the intercell distance on the source side is formed to be less than the intercell distance on the drain side, the source region alone is filled with the sidewall insulating film 20. Then, as shown in FIG. 21D, ions (e.g., P) are implanted over the sidewall insulating film 20. Since the source side is filled with the sidewall insulating film 20, a source diffusion region 2 is formed to be shallower than a drain diffusion region 3 and to have a low concentration. Thus, the high-resistance region is formed at the source edge. Then, the sidewall insulating film 20 is released, thereby obtaining a structure shown in FIG. 21E.

As described above, according to the third embodiment, the depth of the source diffusion region 2 is made shallower than the depth of the drain diffusion region 3 without using the mask, and the high-resistance offset region can be provided at the source edge, so that write characteristics can be improved, as in the first embodiment.

FOURTH EMBODIMENT

Figure 22:
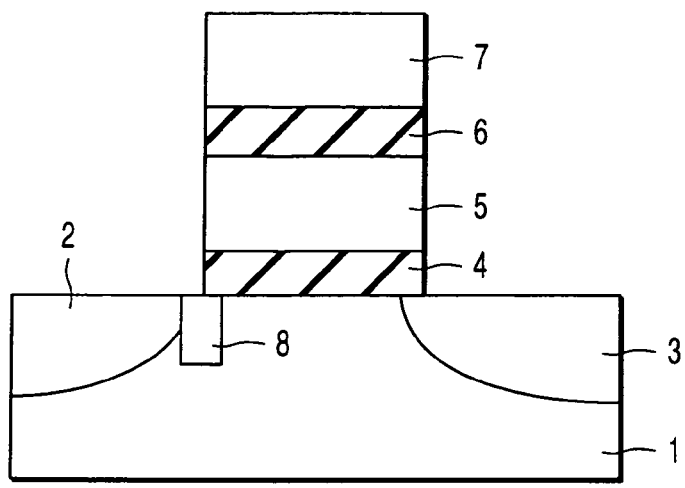
FIG. 22 is a sectional view showing an element structure of a nonvolatile semiconductor memory device in a fourth embodiment.
Figure 23:
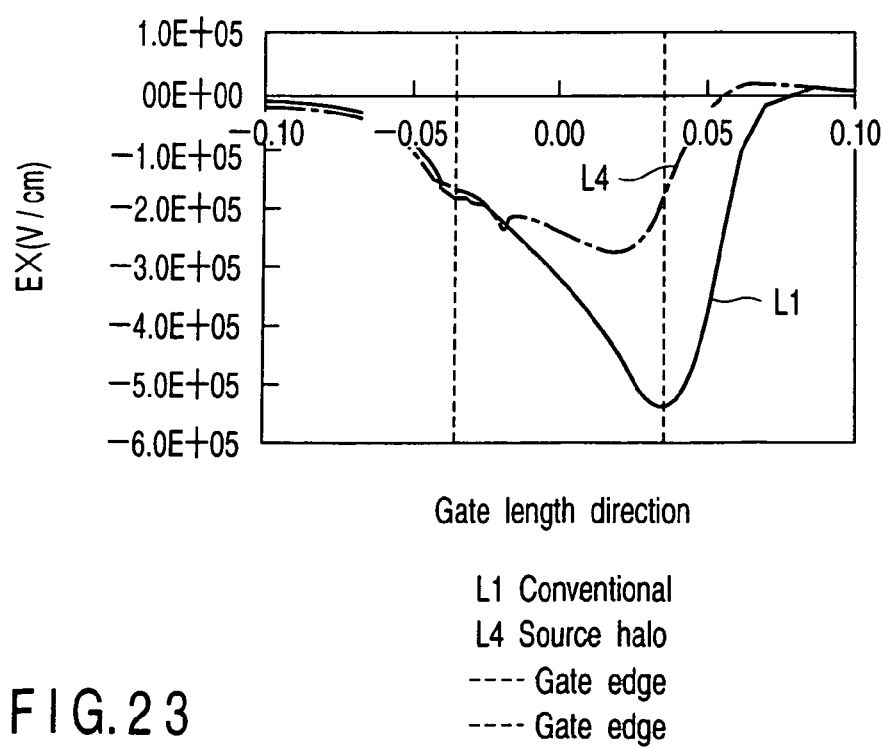
FIG. 23 is a diagram showing that an electric field distribution in a gate length direction on a substrate surface changes due to the presence of a high-resistance impurity concentration region at a source edge, in the nonvolatile semiconductor memory device in the fourth embodiment.
Figure 24:
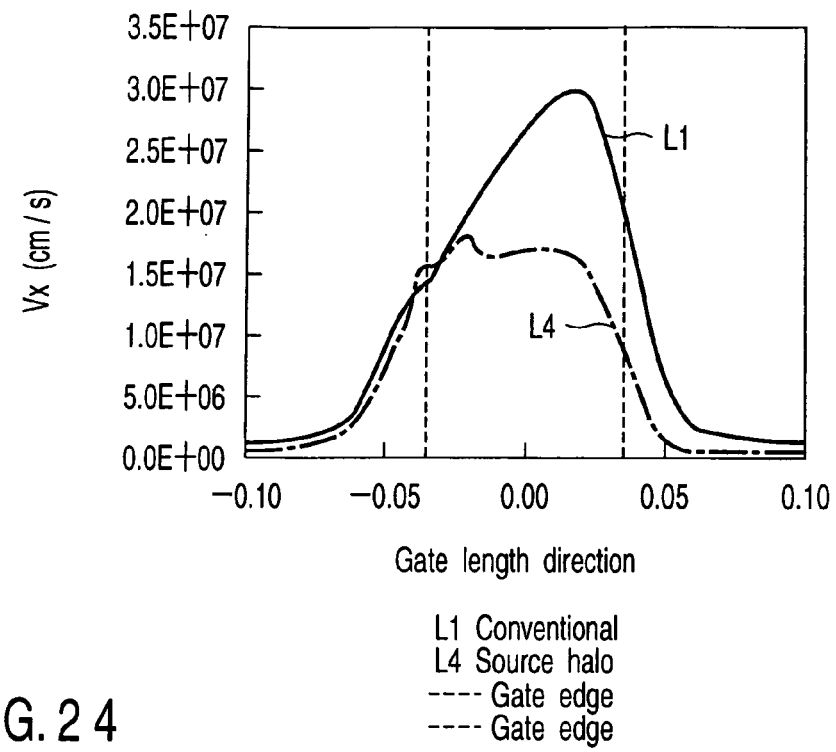
FIG. 24 is a diagram showing that a velocity distribution in the gate length direction on the substrate surface changes due to the presence of the high-resistance impurity concentration region at the source edge, in the nonvolatile semiconductor memory device in the fourth embodiment.
Figure 25:
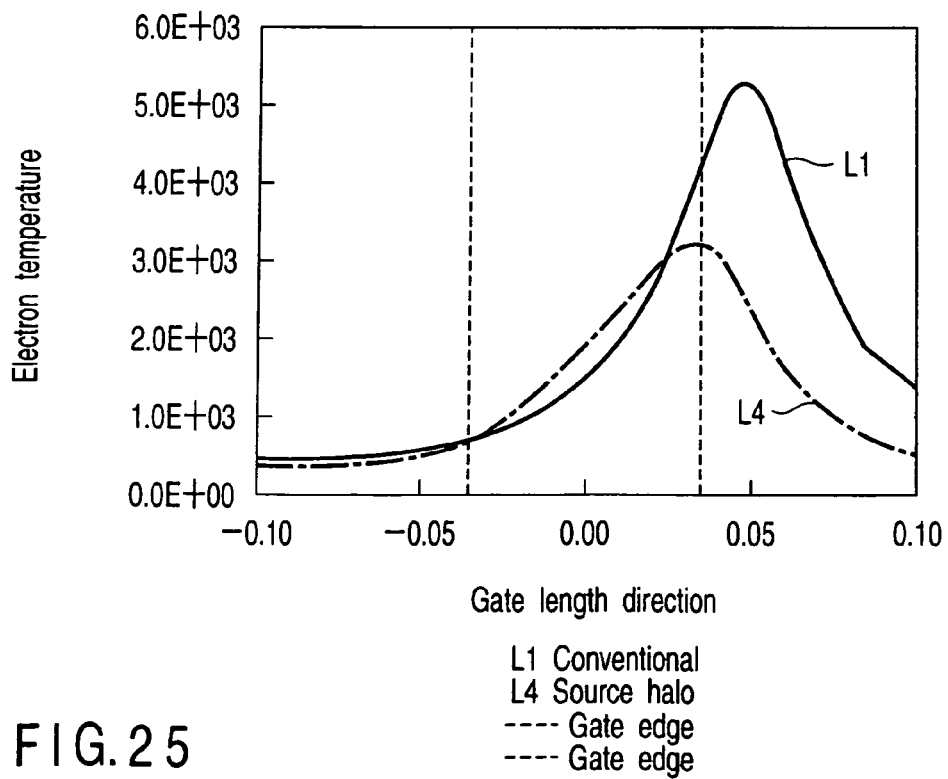
FIG. 25 is a diagram showing that an electron temperature distribution in the gate length direction on the substrate surface changes due to the presence of the high-resistance impurity concentration region at the source edge, in the nonvolatile semiconductor memory device in the fourth embodiment.
Figure 26:
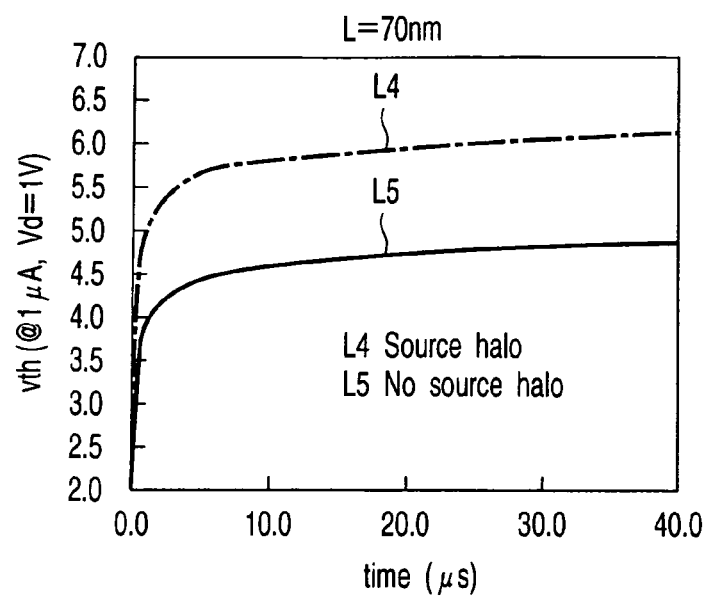
FIG. 26 is a diagram showing that write characteristics (threshold voltages) improve due to the presence of the high-resistance impurity concentration region at the source edge, in the nonvolatile semiconductor memory device in the fourth embodiment.

In an element structure in a fourth embodiment, a heavily-doped impurity region 8 (source halo region) of the same conductivity type as substrate impurities is provided at an edge (source edge) in the vicinity of a floating gate of a source diffusion region 2, as shown in FIG. 22. Owing to this heavily-doped impurity region 8 formed at the source edge, a high-resistance region is formed at the source edge. Thus, a peak of electric field concentration in a gate length direction is decreased as shown in FIG. 23, and velocity overshoot is suppressed as shown in FIG. 24. Further, as shown in FIG. 25, since the peak position of electron temperature is also more displaced to the source side, an implanting point of hot electrons more moves to the source side. Therefore, write characteristics are significantly improved as compared with write characteristics in the conventional structure, as shown in FIG. 26. Here, in FIGS. 23 to 26, a gate length is 70 nm, and the impurity concentration in the heavily-doped impurity region 8 is $2 \times 10^{18}/cm^3$. Thus, the heavily-doped impurity region of the same conductivity type as the substrate impurities is formed at the source edge, such that the write characteristics of the NOR-type flash memory can be improved.

FIGS. 27A to 27E are sectional views showing stepwise a method of manufacturing the NOR-type nonvolatile semiconductor memory device according to the fourth embodiment of the present invention, and a plan view thereof is similar to FIG. 16. First, layers to be a tunnel insulating film 4, a floating gate 5, an intergate insulating film 6 and a control gate 7 are stacked on a substrate 1 in order (FIG. 27A), and lithography is used to carry out stacked gate patterning, and then a sidewall insulating film 15 is formed by an oxidation process to form a structure shown in FIG. 27B.

Figures 27A, 27B, 27C:
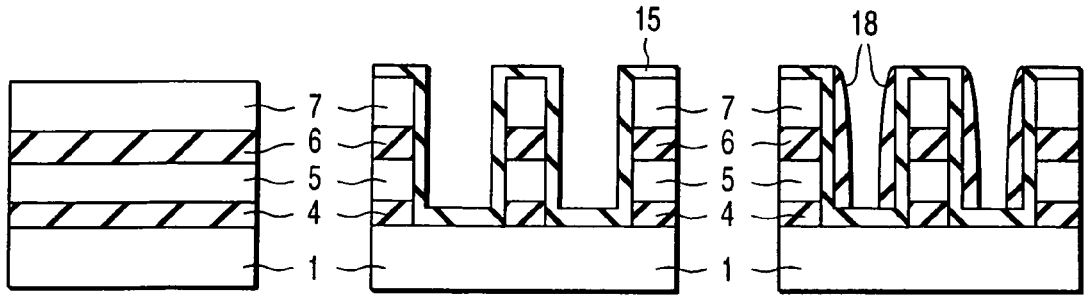
FIGS. 27A to 27E are sectional views showing stepwise a method of manufacturing the nonvolatile semiconductor memory device in the fourth embodiment.
Figures 27D, 27E:
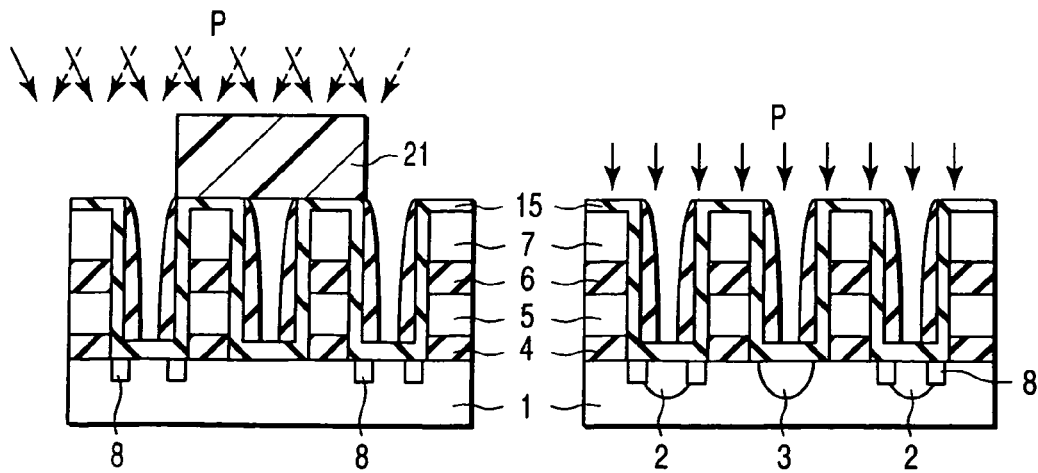

Next, as shown in FIG. 27C, an interlayer insulating film (not shown) is deposited, and this is processed by anisotropic etching such as RIE to form a sidewall insulating film region 18. The kind of insulating film forming the sidewall insulating film region 18 includes TEOS, a silicon nitride film, or the like. Then, as shown in FIG. 27D, a mask 21 made of an insulating film or a resist capable of blocking the ion implantation is provided by patterning using lithography to cover a drain region. Owing to this mask 21, it is possible to prevent high-concentration impurities from being implanted into a drain edge by the ion implantation, and the ion implantation oblique with respect to the gate length direction is carried out from two directions, such that the heavily-doped impurity region can be formed only at the source edge. Then, as shown in FIG. 27E, the source/drain diffusion regions are formed by the ion implantation, so that the device structure shown in FIG. 22 can be formed.

As described above, according to the fourth embodiment, the heavily-doped impurity region of the same conductivity type as the substrate is provided at the source edge to provide the high-resistance region at the source edge, so that write characteristics can be improved, as in the first embodiment.

FIFTH EMBODIMENT

In an element structure of a NOR-type nonvolatile semiconductor memory device according to a fifth embodiment, a heavily-doped impurity region 8 (source halo region) of the same conductivity type as substrate impurities is also provided at an edge (source edge) in the vicinity of a floating gate of a source diffusion region 2, as shown in FIG. 28. In this respect, this element structure is similar to the element structure in the fourth embodiment, but in addition to this, the distance between cell transistors on a drain side is formed to be less than the distance between cell transistors on a source side in the memory device of the fifth embodiment. Owing to such a structural characteristic, it is possible to provide the heavily-doped impurity region 8 (source halo region) of the same conductivity type as the substrate impurities only at the source edge without adding a mask.

FIGS. 29A to 29D are sectional views showing stepwise a method of manufacturing the NOR-type nonvolatile semiconductor memory device according to the fifth embodiment, and a plan view thereof is similar to FIG. 16. First, layers to be a tunnel insulating film 4, a floating gate 5, an intergate insulating film 6 and a control gate 7 are stacked on a substrate 1 in order, and lithography is used to carry out stacked gate patterning, and then a sidewall insulating film 15 is formed by an oxidation process to form a structure shown in FIG. 29A. Here, in the stacked gate patterning using the lithography, the intercell distance on the side of a drain 3 is formed to be less than the intercell distance on the side of a source 2.

Next, as shown in FIG. 29B, an interlayer insulating film 19 is deposited. The insulating film 19 may be any insulating film as long as it is in a selected ratio to the sidewall insulating film 15 which covers a cell transistor region comprising the substrate 1, the tunnel insulating film 4, the floating gate 5, the intergate insulating film 6 and the control gate 7, and such an insulating film includes, for example, a silicon nitride film.

Next, as shown in FIG. 29C, the interlayer insulating film 19 is etched to form a sidewall insulating film 20. Now, since the intercell distance on the side of the drain 3 is formed to be less than the intercell distance on the side of the source 2, the drain region alone is filled (buried) with the sidewall insulating film 20. Then, as shown in FIG. 29D, the ion implantation oblique with respect to the gate length direction is carried out from two directions, such that the heavily-doped impurity region 8 of the same conductivity type as the substrate impurities is formed at the source edge. At this point, because the drain region is filled (buried) with the insulating film region 20, the heavily-doped impurity region 8 is not formed at a drain edge.

Next, as shown in FIG. 29E, the source diffusion layer 2 and the drain diffusion layer 3 are formed by ion implantation after the insulating film region 20 is removed. Thus, it is possible to manufacture the NOR-type nonvolatile semiconductor memory device (FIG. 28) according to the fifth embodiment without adding the mask.

As described above, according to the fifth embodiment, since the distance between the cell transistors on the drain side is formed to be less than the distance between the cell transistors on the source side, the heavily-doped impurity region of the same conductivity type as the substrate is provided at the source edge without adding the mask, such that a high-resistance region can be provided only at the source edge. Thus, a write characteristic improving effect similar to that in the fourth embodiment can be obtained without increasing manufacturing costs.

SIXTH EMBODIMENT

Figure 30:
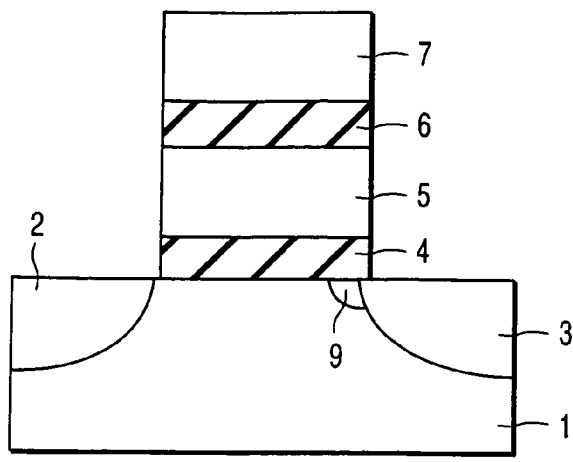
FIG. 30 is a sectional view showing an element structure of a nonvolatile semiconductor memory device in a sixth embodiment.

In a sixth embodiment, a lightly-doped second drain region (LDD structure) with a low impurity concentration is provided at an inner edge of a drain region 3, as shown in FIG. 30. In the present embodiment, an LDD region 9 is formed only at a drain edge, and no LDD region is formed at a source edge, so that the resistance of the source edge is higher than the resistance of the region at the drain edge where the LDD region 9 is formed. Therefore, write characteristics are improved in the structure shown in FIG. 30 for the reason similar to that described in the first to fifth embodiments. It should be noted that in a conventional LDD structure, a low resistance region is provided at inner edges of both the source and drain regions, so that it is not possible to obtain effects as in the present embodiment.

Figures 31A, 31B, 31C:
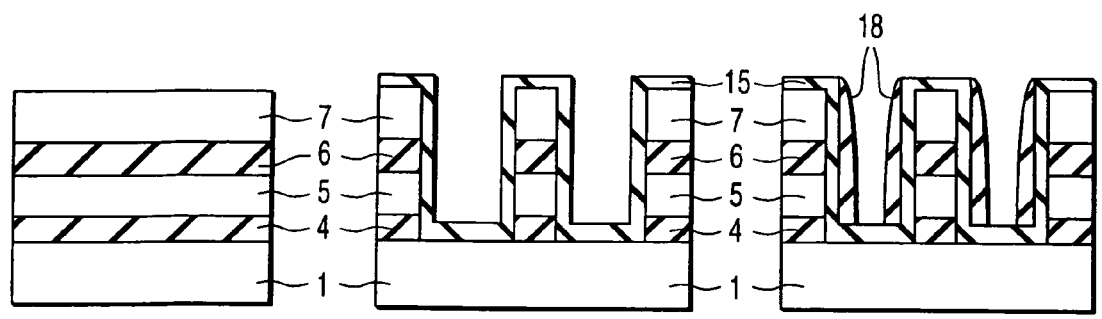
FIGS. 31A to 31E are sectional views showing stepwise a method of manufacturing the nonvolatile semiconductor memory device in the sixth embodiment.

FIGS. 31A to 31E are sectional views showing stepwise a method of manufacturing the NOR-type nonvolatile semiconductor memory device according to the sixth embodiment, and a plan view thereof is similar to FIG. 16. Layers to be a tunnel insulating film 4, a floating gate 5, an intergate insulating film 6 and a control gate 7 are stacked on a substrate 1 in order (FIG. 31A), and lithography is used to carry out gate patterning, and then a sidewall insulating film 15 is formed by an oxidation process to form a structure shown in FIG. 31B. Next, as shown in FIG. 31C, an interlayer insulating film (not shown) is deposited, and a sidewall insulating film region 18 is formed by removing means such as etching. The kind of insulating film forming the sidewall insulating film region 18 includes TEOS, a silicon nitride film, or the like.

Figures 31D, 31E:
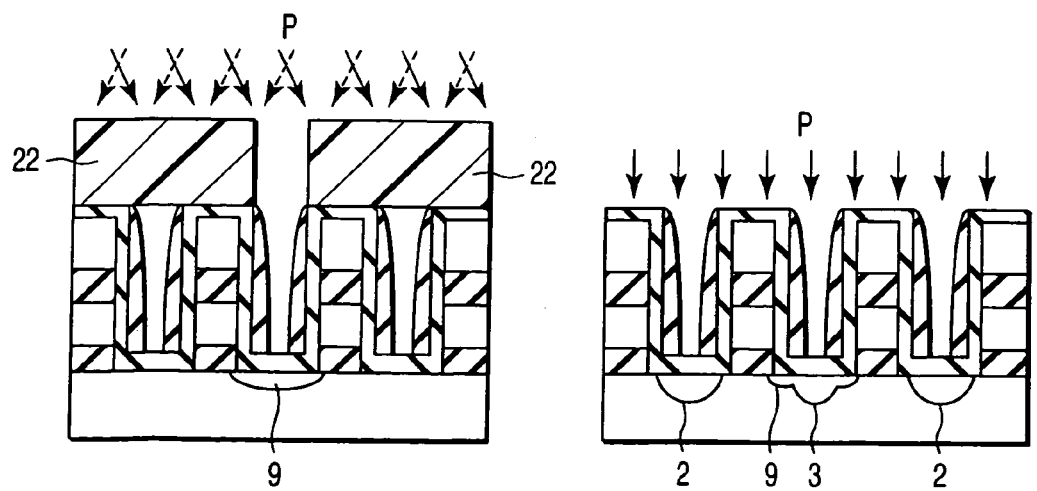

Next, as shown in FIG. 31D, a mask 22 made of an insulating film or a resist capable of blocking ion implantation is provided by patterning using lithography to cover regions except for a drain region. The presence of this mask 22 makes it possible to prevent an LDD region from being formed in a source region, and the ion implantation of impurities (e.g., P) oblique with respect to a gate length direction is carried out from two directions, such that the LDD region 9 can be formed only in the drain region. Then, as shown in FIG. 31E, the source/drain diffusion layers are formed by the ion implantation of impurities (e.g., P), so that a device structure shown in FIG. 30 can be formed.

As described above, according to the sixth embodiment, the LDD region is provided at the drain edge to provide the high-resistance region at the source edge, so that write characteristics can be improved, as in the first embodiment.

SEVENTH EMBODIMENT

Figure 32:
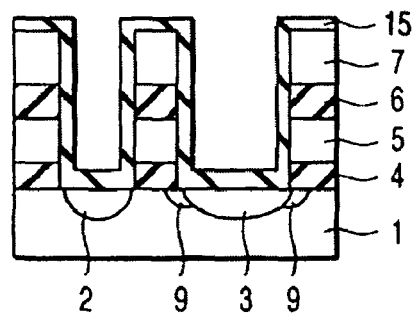
FIG. 32 is a sectional view showing an element structure of a nonvolatile semiconductor memory device in a seventh embodiment.

A NOR-type nonvolatile semiconductor memory device according to a seventh embodiment is characterized in that the distance between cell transistors on the side of a source 2 is formed to be less than the distance between cell transistors on the side of a drain 3, as shown in FIG. 32. A method of manufacturing an element structure shown in FIG. 32 will be described using FIGS. 33A to 33E.

Figures 33A, 33B, 33C:
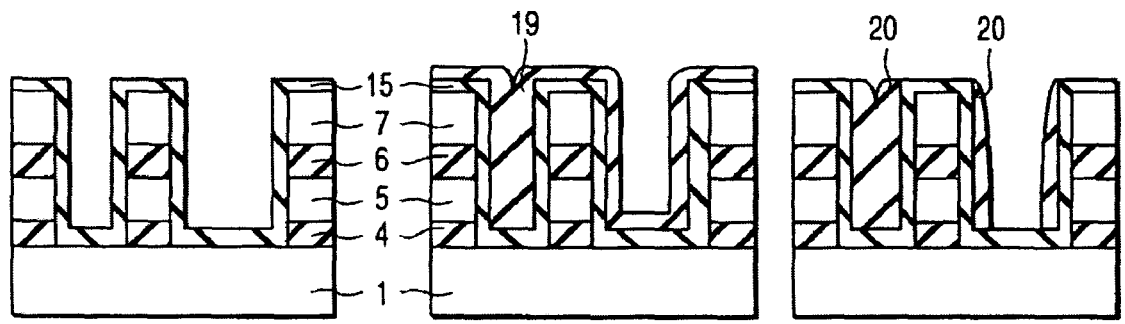
FIGS. 33A to 33E are sectional views showing a method of manufacturing the nonvolatile semiconductor memory device in the seventh embodiment.

First, layers to be a tunnel insulating film 4, a floating gate 5, an intergate insulating film 6 and a control gate 7 are stacked on a substrate 1 in order, and lithography is used to carry out stacked gate patterning, and then a sidewall insulating film 15 is formed by an oxidation process to form a structure shown in FIG. 33A. Here, in the gate patterning using the lithography, the intercell distance on the source side is formed to be less than the intercell distance on the drain side.

Next, as shown in FIG. 33B, an interlayer insulating film 19 is deposited. The insulating film 19 may be any insulating film as long as it is in a selected ratio to the sidewall insulating film 15 which covers a cell transistor region comprising the substrate 1, the tunnel insulating film 4, the floating gate 5, the intergate insulating film 6 and the control gate 7, and such an insulating film includes, for example, a silicon nitride film. Then, as shown in FIG. 33C, the interlayer insulating film 19 is etched to form a sidewall insulating film 20. Now, since the intercell distance on the source side is formed to be less than the intercell distance on the drain side, the source region alone is filled with the sidewall insulating film 20.

Figures 33D, 33E:
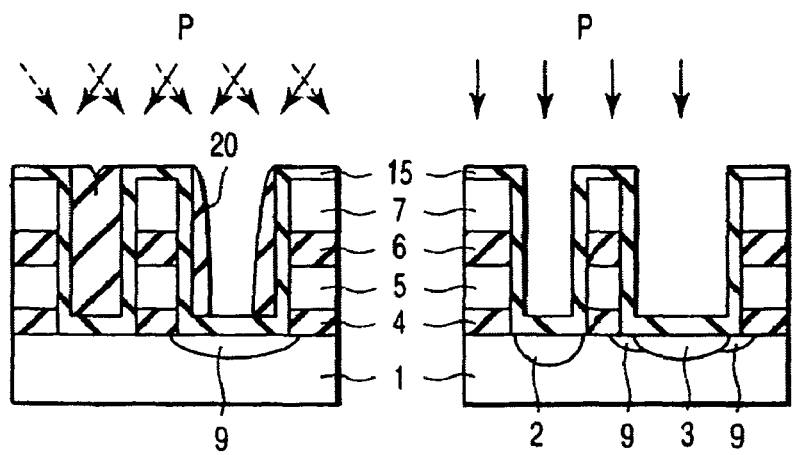
Figures 34A, 34B, 34C:
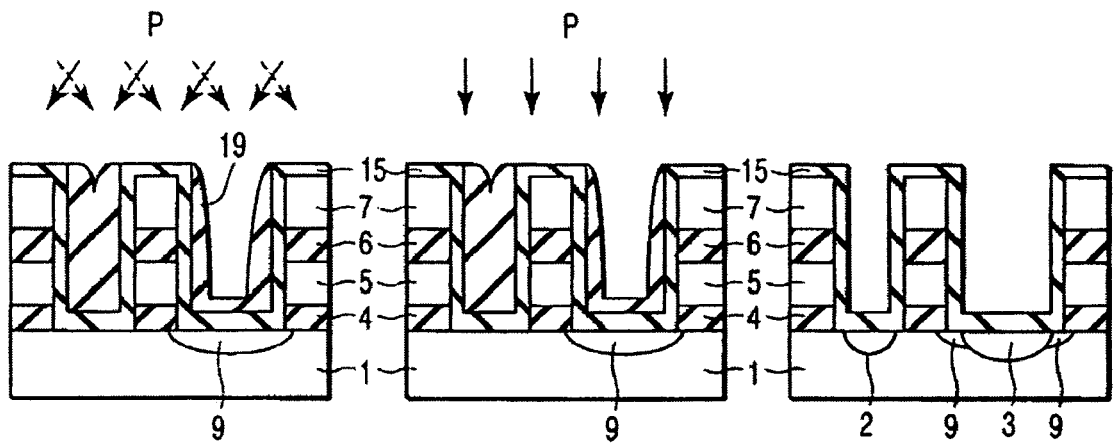
FIGS. 34A to 34C are sectional views showing another method of manufacturing the nonvolatile semiconductor memory device in the seventh embodiment.

Next, as shown in FIG. 33D, ion implantation oblique with respect to a gate length direction for forming an LDD region 9 is carried out from two directions. Because the source side is filled with the insulating film 20, no LDD region is formed at a source edge. Then, as shown in FIG. 33E, ion implantation for forming a source diffusion region 2 and a drain diffusion region 3 is carried out after the insulating film 20 is removed. Thus, it is possible to manufacture the element structure shown in FIG. 32. Here, as shown in FIGS. 34A to 34C, the ion implantation for forming the source diffusion region 2 and the drain diffusion region 3 may be carried out before the insulating film 20 is removed. In this case, as shown in FIG. 34C, the source diffusion region 2 has a lower peak concentration than that of the drain diffusion region 3, and is formed to be shallower than the drain diffusion region 3.

As described above, according to the seventh embodiment, since the distance between the cell transistors on the source side is formed to be less than the distance between the cell transistors on the drain side, the LDD region can be provided only at the drain edge without adding a mask, and a high-resistance region can be provided only at the source edge. Thus, a write characteristic improving effect similar to that in the fourth embodiment can be obtained without increasing manufacturing costs.

EIGHTH EMBODIMENT

The first to seventh embodiments assume, as a conventional structure, a structure having a control gate, an intergate insulating film, a floating gate, a tunnel insulating film and a substrate. However, the first to seventh embodiments are also effective in a metal-oxide-nitride-oxide semiconductor (MONOS) structure. A nonvolatile semiconductor memory device using the MONOS structure is called an NROM.

Figure 35:
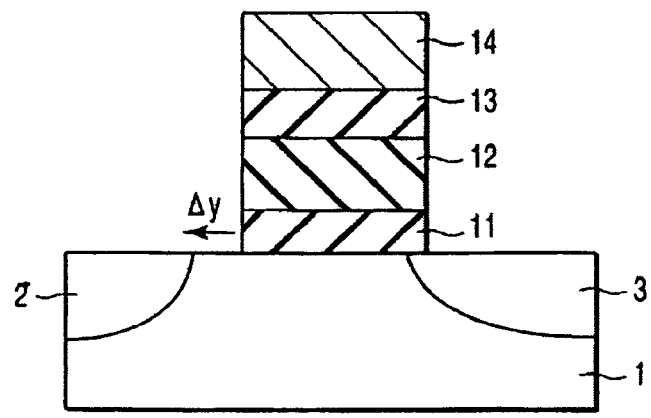
FIG. 35 is a sectional view showing an element structure of a nonvolatile semiconductor memory device in an eighth embodiment.

As shown in FIG. 35, a source diffusion region 2 and a drain diffusion region 3 are oppositely formed on a semiconductor substrate 1. On the surface of the semiconductor substrate 1 between the source diffusion region 2 and the drain diffusion region 3, there is formed a stacked gate structure of a first silicon oxide film (gate insulating film) 11, a silicon nitride film (charge accumulation film) 12, a second silicon oxide film (interlayer insulating film) 13 and a metal gate (control gate) 14. In this element structure, the source diffusion region 2 is formed to be offset by $\Delta y$ from the edge of the silicon nitride film (charge memory layer) 12, as in the first embodiment. However, it should be understood that a structure similar to those in the second to seventh embodiments can be employed.

In the MONOS structure, electrons are captured by a trap site present in the silicon nitride film 12 to write information. In the first to seventh embodiments, effects similar to those in the first to seventh embodiments can also be obtained for the NROM in which an upper structure of the substrate has the MONOS structure.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device comprising:
   a semiconductor substrate of a first conductivity type;
   a pair of a source diffusion region and a drain diffusion region of a second conductivity type oppositely formed on a surface of the semiconductor substrate; and
   a plurality of stacked structures, each having a gate insulating film, a charge accumulation film, an interlayer insulating film and a control gate which are formed in order on a channel region of the surface of the semiconductor substrate interposed between the source diffusion region and the drain diffusion region, an edge of the stacked structure in the vicinity of the source region being formed away from a junction position between the source diffusion region and the channel region,
   wherein a highly-doped impurity region of the first conductivity type, whose impurity concentration is higher than that of the substrate, is formed in the channel region adjacent to the source diffusion region around an edge of the stacked structure, and
   a distance between the stacked structures at the drain diffusion region is shorter than a distance between the structures at source diffusion region.

2. The device according to claim 1, wherein the charge accumulation film includes polysilicon.

3. The device according to claim 1, wherein the charge accumulation film includes silicon nitride.

* * * * *